(12) United States Patent
Radke

(10) Patent No.: US 9,983,928 B2
(45) Date of Patent: *May 29, 2018

(54) APPARATUSES AND METHODS INCLUDING ERROR CORRECTION CODE ORGANIZATION

(71) Applicant: Micron Technology, Inc., Boise, ID (US)

(72) Inventor: William Henry Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/148,321

(22) Filed: May 6, 2016

(65) Prior Publication Data

US 2016/0253237 A1 Sep. 1, 2016

Related U.S. Application Data

(63) Continuation of application No. 14/600,800, filed on Jan. 20, 2015, now Pat. No. 9,336,086, which is a
(Continued)

(51) Int. Cl.
*G06F 11/10* (2006.01)
*H03M 13/11* (2006.01)
(Continued)

(52) U.S. Cl.
CPC ...... *G06F 11/1068* (2013.01); *G06F 11/1016* (2013.01); *G06F 11/1048* (2013.01);
(Continued)

(58) Field of Classification Search
CPC ............ G06F 11/1068; G06F 11/1076; G06F 11/1008; G06F 11/1072; G06F 11/1016;
(Continued)

(56) References Cited

U.S. PATENT DOCUMENTS 7,644,336 B2 1/2010 Yang et al.
8,495,465 B1 * 7/2013 Anholt .................. H03M 13/29
714/763
(Continued)

FOREIGN PATENT DOCUMENTS

CN 104272396 A 1/2015
JP 11191758 A 7/1999
(Continued)

OTHER PUBLICATIONS

"Chinese Application Serial No. 201380023047.3, Office Action dated May 6, 2015", W/ English Translation, 9 pgs.
(Continued)

*Primary Examiner* — April Y Blair
*Assistant Examiner* — Dipakkumar Gandhi
(74) *Attorney, Agent, or Firm* — Schwegman Lundberg & Woessner, P.A.

(57) ABSTRACT

Some embodiments include apparatuses and methods having first memory cells, a first access line configured to access the first memory cells, second memory cells, and a second access line configured to access the second memory cells. One of such apparatuses can include a controller configured to cause data to be stored in a memory portion of the first memory cells, to cause a first portion of an error correction code associated with the data to be stored in another memory portion of the first memory cells, and to cause a second portion of the error correction code to be stored in the second memory cells. Other embodiments including additional apparatuses and methods are described.

17 Claims, 8 Drawing Sheets

Related U.S. Application Data continuation of application No. 13/413,363, filed on Mar. 6, 2012, now Pat. No. 8,954,825.

(51) Int. Cl.
| | | |
|---|---|---|
| *H03M 13/35* | (2006.01) | |
| *G11C 29/52* | (2006.01) | |
| *H03M 13/29* | (2006.01) | |
| *G06F 11/32* | (2006.01) | |

(52) U.S. Cl.
CPC .......... *G06F 11/1072* (2013.01); *G11C 29/52* (2013.01); *H03M 13/116* (2013.01); *H03M 13/2906* (2013.01); *H03M 13/356* (2013.01)

(58) Field of Classification Search
CPC ..... G06F 11/1048; G11C 29/52; G11C 29/48; H03M 13/2906; H03M 13/09; H03M 13/116; H03M 13/356
See application file for complete search history.

(56) References Cited

U.S. PATENT DOCUMENTS

| | | | | |
|---|---|---|---|---|
| 8,954,825 | B2 * | 2/2015 | Radke | G06F 11/1048 714/718 |
| 9,336,086 | B2 * | 5/2016 | Radke | G06F 11/1048 |
| 2006/0107130 | A1 | 5/2006 | Baker et al. | |
| 2006/0259847 | A1 | 11/2006 | Villa | |
| 2007/0300130 | A1 | 12/2007 | Gorobets | |
| 2008/0034270 | A1 | 2/2008 | Onishi et al. | |
| 2008/0109702 | A1 | 5/2008 | Brandman | |
| 2008/0184094 | A1 | 7/2008 | Murray et al. | |
| 2009/0019321 | A1 | 1/2009 | Radke | |
| 2009/0235145 | A1 | 9/2009 | Ito et al. | |
| 2010/0107033 | A1 | 4/2010 | Kuri et al. | |
| 2010/0131806 | A1 | 5/2010 | Weingarten et al. | |
| 2010/0162083 | A1 | 6/2010 | Chung et al. | |
| 2010/0218071 | A1 * | 8/2010 | Lastras-Montano | G06F 11/1008 714/763 |
| 2010/0235605 | A1 | 9/2010 | Perry et al. | |
| 2010/0251068 | A1 | 9/2010 | Lin et al. | |
| 2011/0214034 | A1 | 9/2011 | Otsuka | |
| 2011/0299333 | A1 * | 12/2011 | Moschiano | G11C 11/5628 365/185.03 |
| 2012/0320672 | A1 * | 12/2012 | Meir | G11C 7/06 365/185.03 |
| 2013/0238958 | A1 | 9/2013 | Radke | |
| 2015/0135037 | A1 | 5/2015 | Radke | |

FOREIGN PATENT DOCUMENTS

| | | | | |
|---|---|---|---|---|
| JP | 11283396 | A | 10/1999 | |
| JP | 2000149592 | A | 5/2000 | |
| JP | 2006135584 | A | 5/2006 | |
| JP | 2008041171 | A | 2/2008 | |
| JP | 2008165805 | A | 7/2008 | |
| JP | 2009282923 | A | 12/2009 | |
| JP | 2011081776 | A | 4/2011 | |
| JP | 2011128751 | A | 6/2011 | |
| JP | 2011180911 | A | 9/2011 | |
| JP | 2011198272 | A | 10/2011 | |
| JP | 2011198272 | A * | 10/2011 | .......... G06F 11/1012 |
| JP | 2012022422 | A | 2/2012 | |
| JP | 2012094132 | A | 5/2012 | |
| TW | 201025346 | A1 | 7/2010 | |
| TW | 201351125 | A | 12/2013 | |
| WO | WO 2008139441 | A2 * | 11/2008 | .......... G06F 11/1072 |
| WO | WO-2009009076 | A2 | 1/2009 | |
| WO | WO-2013134066 | A1 | 9/2013 | |

OTHER PUBLICATIONS

"Chinese Application Serial No. 201380023047.3, Response filed Sep. 18, 2015 to Office Action dated May 6, 2015", W/ English Claims, 13 pgs.
"European Application Serial No. 13757577.5, Extended European Search Report dated Nov. 4, 2015", 11 pgs.
"European Application Serial No. 13757577.5, Response filed May 12, 2015 to Communication pursuant to Rules 161 and 162 EPC dated Nov. 5, 2014", With the current claims, 17 pgs.
"International Application Serial No. PCT/US2013/028644, International Preliminary Report on Patentability dated Sep. 18, 2014", 8 pgs.
"International Application Serial No. PCT/US2013/028644, International Search Report dated Jun. 21, 2013", 3 pgs.
"International Application Serial No. PCT/US2013/028644, Written Opinion dated Jun. 21, 2013", 6 pgs.
"Japanese Application Serial No. 2014-560980, Office Action dated Feb. 16, 2016".
Te-Hsuan, Chen, et al., "An Adaptive-Rate Error Correction Scheme for NAND Flash Memory", 27th IEEE VLSI Test Symposium, 2009. VTS '09, IEEE, Piscataway, NJ, USA, (May 3, 2009), 53-58.
"European Application Serial No. 13757577.5, Response filed May 27, 2016 to Extended European Search Report dated Nov. 4, 2015", 39 pgs.
"Japanese Application Serial No. 2014-560980, Appeal of an Adverse Decision Domestic Applicant dated Aug. 17, 2016", W/ Machine Translation.
"Japanese Application Serial No. 2014-560980, Examiners Decision of Final Refusal dated Jun. 7, 2016", W/ Machine Translation.
"Japanese Application Serial No. 2014-560980, Reconsideration by Examiner dated Sep. 15, 2016", W/ Machine Translation, 8 pgs.
"Japanese Application Serial No. 2014-560980, Response filed May 11, 2016 to Office Action dated Aug. 17, 2016", W/ Machine Translation, 13 pgs.
"Taiwanese Application Serial No. 102107947, Office Action dated Aug. 10, 2016", W/ English Translation, 15 pgs.
"Japanese Application Serial No. 2014-560980, Office Action dated Apr. 25, 2017", W/ English Translation, 9 pgs.
"Japanese Application Serial No. 2014-560980, Response filed Jun. 2, 2017 to Office Action dated Apr. 25, 2017", w/English Claims, 13 pgs.
"Taiwanese Application Serial No. 102107947, Decision of Rejection dated Mar. 16, 2017", w/English Claims, 18 pgs.
"Taiwanese Application Serial No. 102107947, Response filed Feb. 13, 2017 to Office Action dated Aug. 10, 2016", w/English Translation, 47 pgs.
"Taiwanese Application Serial No. 102107947, Response filed May 16, 2017 to Decision of Rejection Mar. 16, 2017", w/English Translation, 47 pgs.

* cited by examiner

200

APPARATUSES AND METHODS INCLUDING ERROR CORRECTION CODE ORGANIZATION

PRIORITY APPLICATION

This application is a continuation of U.S. application Ser. No. 14/600,800, filed Jan. 20, 2015, which is a continuation of U.S. application Ser. No. 13/413,636, filed Mar. 6, 2012, now issued as U.S. Pat. No. 8,954,825, all of which are incorporated herein by reference in their entirety.

BACKGROUND

Memory devices, such as flash memory, are widely used in computers and many electronic products. Such memory devices have numerous memory cells. Information can be stored in the memory cells in a write operation. The stored information can be retrieved in a read operation or can be cleared in an erase operation. As memory cell density increases for a given device area, maintaining a reliability of information stored in memory devices may pose a challenge.

DETAILED DESCRIPTION

Figure 1:
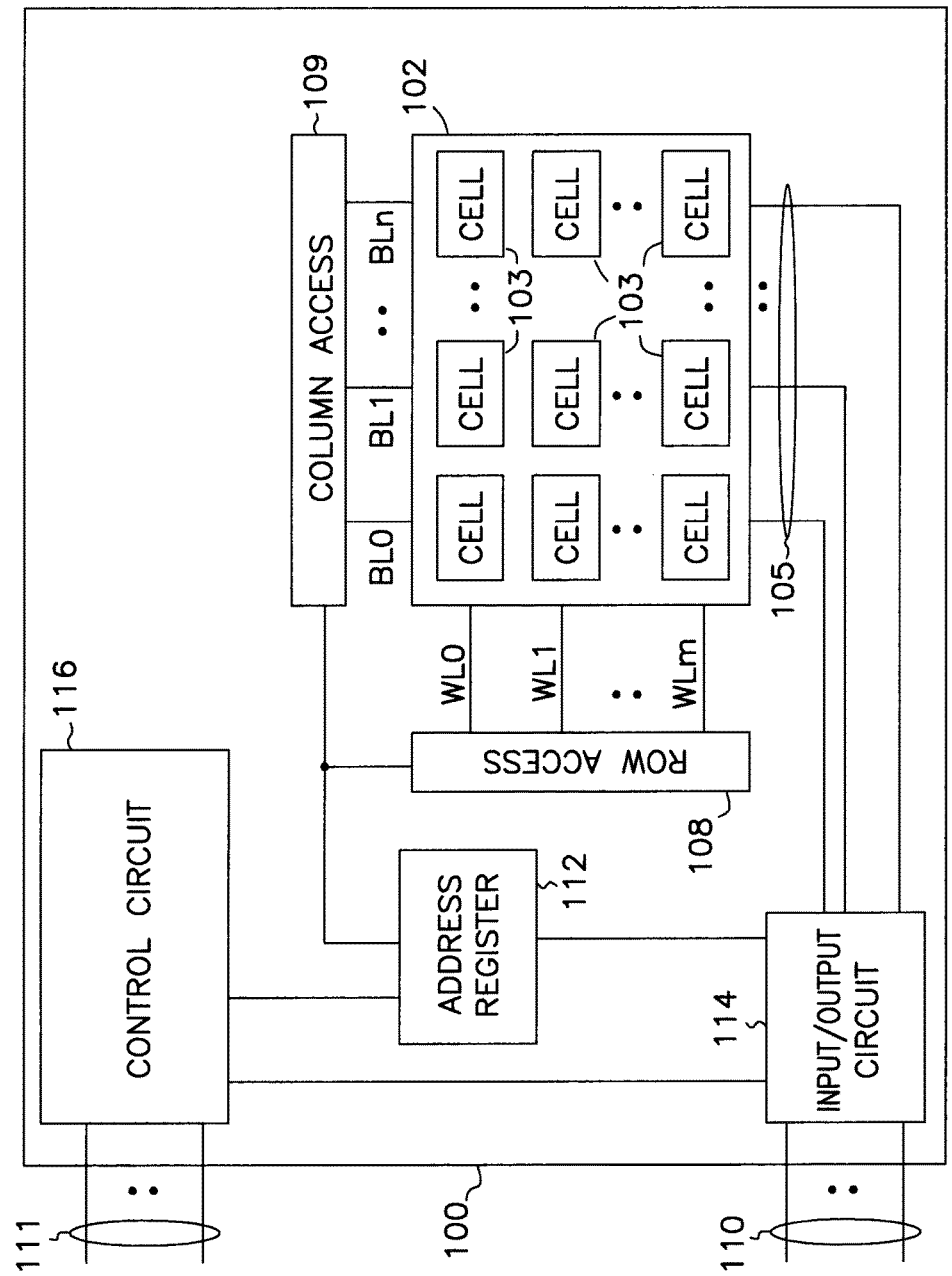
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) WL0 and WL1 through WLm and lines (e.g., data lines) BL0 and BL1 through BLn. Memory device 100 can use lines WL0 and WL1 through WLm and lines to access memory cells 103 and lines 105 to exchange (e.g., transfer) information with memory cells 103.

Row access 108 and column access 109 circuitry can respond to an address register 112 to access memory cells 103 based on row address and column address signals on lines 110, 111, or both. An input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both. The device (e.g., a processor or a memory controller) that sends different commands to memory device 100 can be formed on a same semiconductor die as memory device 100, or such a device (e.g., a processor or a memory controller) could be formed on a semiconductor die different from a semiconductor die that forms memory device 100.

Memory device 100 can respond to commands to perform memory operations on memory cells 103, such as performing a write (e.g., programming) operation to store (e.g., program) information in memory cells 103 or a read operation to retrieve stored information from memory cells 103. Memory device 100 can also perform an erase operation to clear information from some or all of memory cells 103.

The information stored in memory cells 103 can include data and error correction code (ECC) associated with the data. The ECC can be generated based on data before the data is stored in memory cells 103. The ECC can include parity check bits. When data and its associated ECC are retrieved from memory cells 103, the ECC can be used to correct errors that may have occurred in the data. ECC associated with data can be internally generated by memory device 100 or externally generated by another device (e.g., a memory controller or a processor).

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located on multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

At least a portion of memory device 100 can include structures similar to or identical to memory devices described below with reference to FIG. 2 through FIG. 8.

Figure 2:
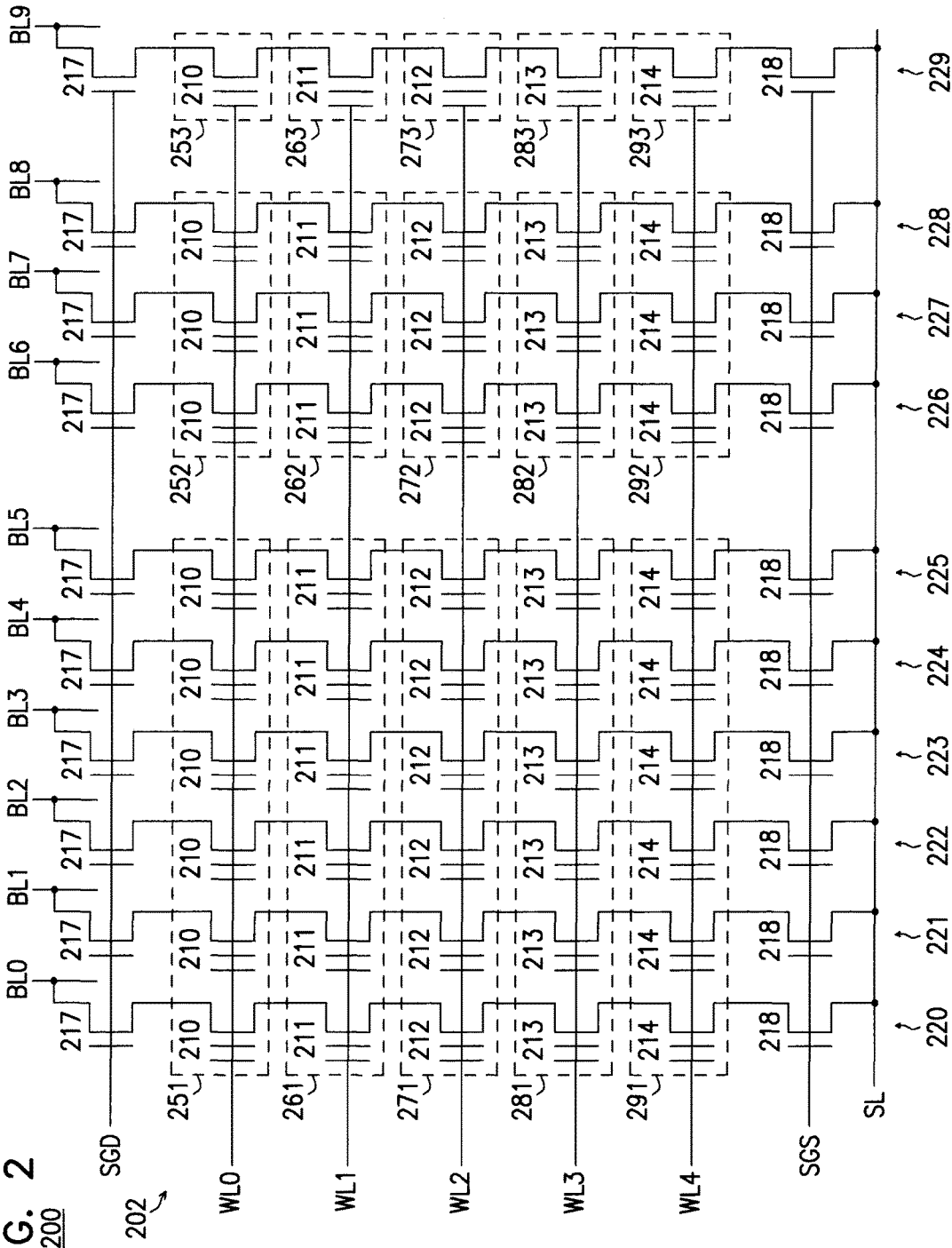
FIG. 2 shows a schematic diagram of a portion of a memory device, according to an embodiment of the invention.

FIG. 2 shows a schematic diagram of a portion of a memory device 200, according to an embodiment of the invention. Memory device 200 can include a memory array 202, which can form part of memory array 102 of FIG. 1. As shown in FIG. 2, memory array 202 can include memory cells 210, 211, 212, 213, and 214 associated with lines WL0, WL1, WL2, WL3, and WL4, respectively. Each of lines WL0, WL1, WL2, WL3, and WL4 can form part of an access line of memory device 200 to access memory cells memory cells 210, 211, 212, 213, and 214 during a memory operation (e.g., a read or write operation). Memory device 200 can include lines BL0 through BL9 respectively. Each of lines BL0 through BL9 can form part of a data line of memory device 200. FIG. 2 shows five lines WL0, WL1, WL2, WL3, and WL4 and ten lines BL0 through BL9 as an example. The number of these lines can vary.

Memory cells 210, 211, 212, 213, and 214 can be arranged in a NAND configuration, as shown in FIG. 2. For example, memory cells 210, 211, 212, and 213 can be arranged as memory cell strings, such as memory cell strings 220 through 229. Each of memory cell strings 220 through 229 can be coupled to one of lines BL0 through BL9 through one of transistors (e.g., select transistor) 217 and to a line SL through one of transistors (e.g., select transistor) 218. Line SL can form part of a source (e.g., source line) of memory device 200.

During a memory operation (e.g., a read or write operation), memory device 200 can use line SGD to turn on transistors 217 to couple memory cell strings 220 through 229 to respective lines BL0 through BL9, or turn off transistors 217 to decouple memory cell strings 220 through 229 from respective lines BL0 through BL9. Memory device 200 can use line SGS to turn on transistors 218 to couple memory cell strings 220 through 229 to line SL, or turn off transistors 218 to decouple memory cell strings 220 through 229 from line SL.

Memory cells 210, 211, 212, 213, and 214 can be physically located on multiple levels of memory device 200, such that the memory cells in the same memory cell string can be stacked over each other in multiple levels of memory device 200. For example, memory cells 214 can be physically located on one level of memory device 200. Memory cells 213 can be physically located over memory cell 214 on another level of memory device 200. FIG. 2 shows an example of twelve memory cell strings 220 through 229 and four memory cells 210, 211, 212, and 213 in each memory cell string. The number of memory cell strings and number of memory cells in each memory cell string can vary.

Memory cells 210 and memory cells 214 can be physically located at respective edges of memory array 202. For example memory cells 210 can be physically located at an edge of memory array 202, such that memory cells 210 can be closer to transistors 217 than other memory cells (e.g., 211, 212, 213, and 214) of memory array 202. In another example, memory cells 214 can be physically located at another edge of memory array 202, such that memory cells 210 can be closest to transistors 218 than other memory cells (e.g., 210, 211, 212, and 213) of memory array 202.

In a memory operation, memory device 200 can selectively access selected memory cells among memory cells 210, 211, 212, 213, and 214 to store information (e.g., in a write operation) in the selected memory cells or to retrieve information (e.g., in a read operation) from the selected memory cells. Information stored in memory cells 210, 211, 212, 213, and 214 can include data and ECC associated with the data. For example, to store information in selected memory cells among memory cells 212, memory device 200 can activate lines WL0 through WL4 such that only memory cells 212 can be accessed. Then memory device 200 can store information in the selected memory cells, for example, by applying an appropriate voltage (e.g., a programming voltage) on line WL2 and lines BL0 through BL9. In another example, to retrieve information (e.g., data and ECC) from selected memory cells among memory cells 212, memory device 200 can activate lines WL0 through WL4 such that only memory cells 212 can be accessed. Then memory device 200 can retrieve stored information from the selected memory cells, for example, by sensing stored information from the selected memory cells via lines BL0 through BL9.

As shown in FIG. 2, memory cells 210, 211, 212, 213, or 214 associated with the same line WL0, WL1, WL2, WL3, or WL4 can be organized into different memory portions where each memory portion can include a number (a group) of memory cells. For example, memory cells 210 (associated with line WL0) can be organized into memory portions 251, 252, and 253. Memory cells 211 (associated with line WL1) can be organized into memory portions 261, 262, and 263. Memory cells 212 (associated with line WL2) can be organized into memory portions 271, 272, and 273. Memory cells 213 (associated with line WL3) can be organized into memory portions 281, 282, and 283. Memory cells 214 (associated with line WL4) can be organized into memory portions 291, 292, and 293.

The memory portions of memory device 200 can store different types of information. For example, memory portions 251, 261, 271, 281, and 291 can store data. Memory portions 252, 253, 262, 263, 272, 273, 282, 283, 292, and 293 can store ECC associated with the respective data stored in memory portions 251, 261, 271, 281, and 291. Alternatively or additionally, memory portions 252, 253, 262, 263, 272, 273, 282, 283, 292, and 293 can also store other types of information (e.g., overhead information or data management information).

FIG. 2 shows a particular number (e.g., six, three, or one) of memory cells in each of memory portions 251, 261, 271, 281, and 291, memory portions 252, 262, 272, 282, and 292, and memory portions 253, 263, 273, 283, and 293, as an example. The number of memory cells in these memory portions can vary.

For simplicity, the following description describes organizations and functions of memory cells associated with one of lines WL0, WL1, WL2, WL3, and WL4, such as memory cells 213 associated with line WL3. Other memory cells 210, 211, 212, and 214 can include similar organizations and functions.

In memory cells 213, memory portion 271 can have a size (e.g., a number of memory cells) that is substantially greater than the combined size of memory portions 272 and 273. For example, memory portion 271 can include approximately 97% (e.g., 96.875%) of the number of all memory cells 213, and memory portions 272 and 273 can include approximately 3% (e.g., 3.125%) of the number of all memory cells 213.

As an example, memory portion 271 can include $65,536=8\times8\times2^{10}$ cells that are capable of storing $8\times8\times2^{10}$ bits (8 Kbytes) of data (e.g., if each of the 65,536 cells is configured to store 1 bit of data) or capable of storing $16\times8\times2^{10}$ bits (16 Kbytes) of data (e.g., if each of the 65,536 cells is configured to store 2 bits of data). Memory portions 272 and 273 can include $2,048=256\times8$ cells that are capable of storing 256 bytes of data (e.g., if each of the 2,048 cells is configured to store 1 bit of data) or capable of storing 512 bytes of data (e.g., if each of the 2,048 cells is configured to store 2 bits of data).

Memory portion 272 can have a size (e.g. a number of memory cells) greater than that of memory portion 273. For example, memory portion 272 can have a size than is three times the size of memory portion 273. Thus, memory portion 272 can be capable of storing ECC having a size that is three times the size of ECC that can be stored in memory portion 273. For example, memory portion 273 can include a number of memory cells that are capable of storing 64 bytes of ECC, and memory portion 272 can include a number of memory cells that are capable of storing 192 bytes of ECC.

Memory portions 251, 261, 271, 281, and 291 can have the same size. For example, each of memory portions 251, 261, 271, 281, and 291 can include $65,536=8\times8\times2^{10}$ cells (capable of storing 8 Kbytes or 16 Kbytes of data in each portion, for example). Memory portions 252, 262, 272, 282, and 292 can have the same size. For example, each of memory portions 252, 262, 272, 282, and 292 can include $1,536=192\times8$ cells (capable of storing 192 bytes or 384 bytes of ECC in each memory portion, for example). Memory portions 253, 263, 273, 283, and 293 can have the same size. For example, each of memory portions 253, 263, 273, 283, and 293 can include $512=64\times8$ cells (capable of storing 64 bytes or 128 bytes of ECC in each memory portion, for example).

Memory cells 210, 211, 212, 213, and 214 can store information (e.g., data and ECC) in a sequential order. For example, information can be stored in memory cells (e.g., all of memory cells 210) of memory portions 251, 252, and 253 (associated with line WL0) before information can be stored in memory cells 211 of memory portions 261, 262, and 263 (associated with line WL1). Information can be stored in memory cells 211 (e.g., all of memory cells 211) of memory portions 261, 262, and 263 (associated with line WL1) before information can be stored in memory cells 212 of memory portions 271, 272, and 273 (associated with line WL2), and so on. Alternatively, other order (e.g., non-sequential order) can be used.

The memory portions of memory cells (210, 211, 212, 213, or 214) associated with the same line among lines WL0, WL1, WL2, WL3, and WL4 can store data and ECC concurrently in a memory operation. In other words, data and ECC can be stored in a parallel fashion in memory cells of the same line (e.g., one of line WL0, WL1, WL2, WL3, or WL4). For example, memory cells 212 in memory portions 271, 272, and 273 can concurrently store data and ECC, such that while data are stored in memory portion 271 in a write operation, ECC are stored in memory portions 272 and 273 in the same write operation. In another example, memory cells 213 in memory portions 281, 282, and 283 can concurrently store data and ECC, such that while data are stored in memory portion 281 in a write operation, ECC are stored in memory portions 282 and 283 in the same write operation.

Figure 3:
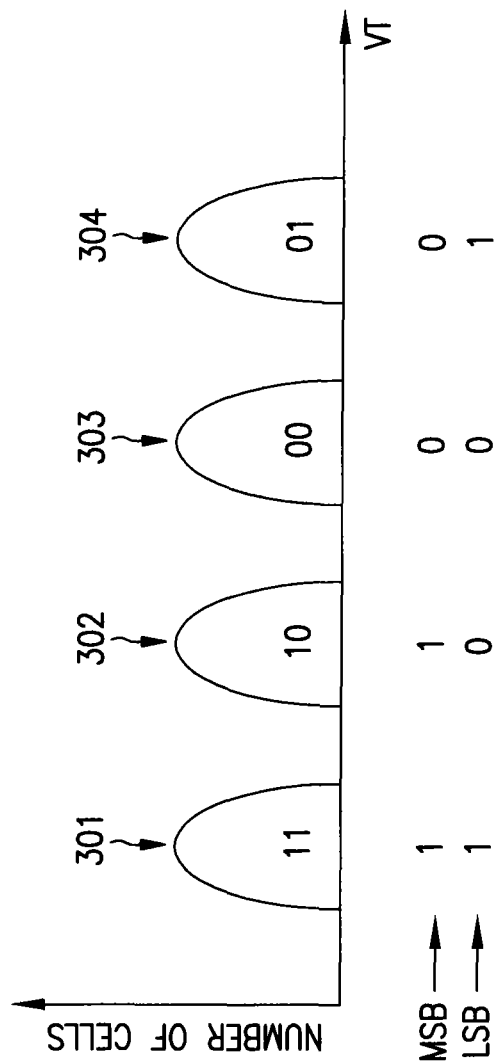
FIG. 3 is a graph showing threshold voltage ranges that can be configured to represent values of information stored in memory cells of the memory device of FIG. 2, according to an embodiment of the invention.

FIG. 3 is a graph showing threshold voltage (VT) ranges 301, 302, 303, and 304 that can be configured to represent values of information (e.g., data or ECC) stored in memory cells 210, 211, 212, 213, and 214 of FIG. 2, according to an embodiment of the invention. As shown in FIG. 3, VT values (e.g., values in volt unit along the VT axis) in one VT range are different from VT values in another VT range. For example, VT range 301 can include the lowest VT values relative to VT values of VT ranges 302, 303, and 304. VT range 304 can include the highest VT values relative to VT values of VT ranges 301, 302, and 303.

As shown in FIG. 3, VT values of VT ranges 301, 302, 303, and 304 can be configured to represent four possible values "00", "01", "10", and "11", respectively, of two bits of information. The order "11", "10", "00", and "01" corresponding to VT ranges 301, 302, 303, and 304, respectively, is an example order. A different order can be used.

FIG. 3 shows four VT ranges as an example. A different number of ranges can be used. For example, eight different VT ranges can be used to represent eight possible values of three bits, including "000", "001", "010", "011", "100", "101", "110", and "111".

In FIG. 2, each of memory cells 210, 211, 212, 213, and 214 can hold a VT value (e.g., after a write operation) that is within one of VT ranges 301, 302, 303, and 304 (FIG. 3) that corresponds to the value of information stored in the memory cell, depending on which of the value "11", "10", "00", or "01" of two bits is stored in a selected memory cell. For example, based on FIG. 3, to store a value "10" in a selected memory cell (e.g., one of 210, 211, 212, 213, and 214 in FIG. 2), a write operation can cause the selected memory cell to hold a VT value within VT range 302. In another example, to store a value "01" in a selected memory cell, a write operation can cause the selected memory cell to hold a VT value within VT range 304.

A read operation can retrieve (e.g., by sensing) the information stored in a selected memory cell to determine the value (e.g., "00", "01", "10", or "11") of information stored in the selected memory cell. For example, in a read operation, if a VT value corresponding to VT range 302 is sensed from a selected memory cell, then a value of "10" (based on FIG. 3) can be generated from the sensed VT value. The value "10" can then be provided (e.g., output) as the value of information stored in the selected memory cell.

As described above with reference to FIG. 2, the information stored in memory cells 210, 211, 212, 213, and 214 (FIG. 2) can include data and ECC. Thus, in FIG. 3, each of values "00", "01", "10", and "11" can represent values of either two bits of data or two bits of ECC. For example, in FIG. 2, since memory cells 213 in memory portion 281 to store data, if a particular memory cell 213 in memory portion 281 has a VT value (e.g., when sensed) within VT range 302 (which corresponds to value "10" in FIG. 3), then stored information in that particular memory cell can represent value "10" of two bits of data. In another example, in FIG. 2, since memory cells 213 in memory portions 282 and 283 can store ECC, if a particular memory cell 213 in memory portion 282 or 283 has a VT value (e.g., when sensed) within VT range 302 (corresponding to value "10" in FIG. 3), then stored information in that particular memory cell can represent value "10" of two bits of ECC.

As shown in FIG. 3, the two bits (having values "00", "01", "10", and "11") of information can be designated as a bit at bit position MSB (e.g., most significant bit) and a bit at bit position LSB (e.g., least significant bit).

Memory device 200 (FIG. 2) can be configured to organize bits of data (to be stored) in pages of information. Each page of information can include data and its associated ECC. The size of data (e.g., 8K bytes) in one page of information can be the same as the size of data in another page of information.

The bits of data in a page of information can include bits that will be stored in the same bit position (e.g., either MSB or LSB). For example, a page of information can include data having bits that will be stored in the same bit position MSB. In another example, another page of information can include data having bits that will be stored in the same bit position LSB.

As shown in FIG. 3, among the bits at bit position MSB, values "1", "1", "0", and "0", in this order, change only one time, from "1" at VT range 302 to "0" at VT range 303. Among the bits at bit position LSB, values "1", "0", "0", and "1", in this order, change twice, such as changing from "1" at VT range 301 to "0" at VT range 302 and changing from "0" at VT range 303 to "1" at VT range 304. Thus, in comparison between bits at bit positions MSB and bits at bit position LSB, the bits at bit position LSB changes more times than the bits at bit position MSB. An error is more likely to occur when a bit changes its values (e.g., between "0" and "1") than when the bit remains at the same value. Thus, an error is more likely (e.g., twice more likely) to occur in the bits at bit position LSB than in the bits at bit position MSB.

Thus, based on the order of values "11", "10", "00", and "01" in FIG. 3, a more error-prone page of information can refer to a page of information that includes data having bits at bit position LSB. A less error-prone page of information can refer to a page of information that includes data having bits at bit position MSB.

In some cases, values "11", "10", "00", and "01" in FIG. 3 can be arranged in an order different from the order shown in FIG. 3. In such cases, depending on the order of values "11", "10", "00", and "01", an error can be more likely to occur in the bits at bit position MSB than in the bits at bit position LSB.

In short, a more error-prone page of information can refer to a page of information that includes data having bits at a bit position (e.g., LSB based on the order of values in FIG. 3) that is more likely to have errors than a page of information that includes data having bits at another bit position (e.g., MSB based on the order of values in FIG. 3). A less error-prone page of information can refer to a page of information that includes data having bits at a bit position (e.g., MSB based on the order of values in FIG. 3) that is less likely to have errors than a page of information that includes data having bits at another bit position (e.g., LSB based on the order of values in FIG. 3).

Thus, as described below with reference to FIG. 4 through FIG. 8, to improve error correction of data, more ECC (e.g., a higher number of ECC bits) can be allocated to data having bits at a bit position that is determined to be more likely to have errors than to data having bits at a bit position that is less likely to have errors. Analysis of bit patterns written into and retrieved from memory cells, such as memory cells 210, 211, 212, and 213, can be performed (e.g., during manufacturing) to determine in which of bit positions (e.g., MSB or LSB) that bits of data more likely to have errors.

Figure 4:
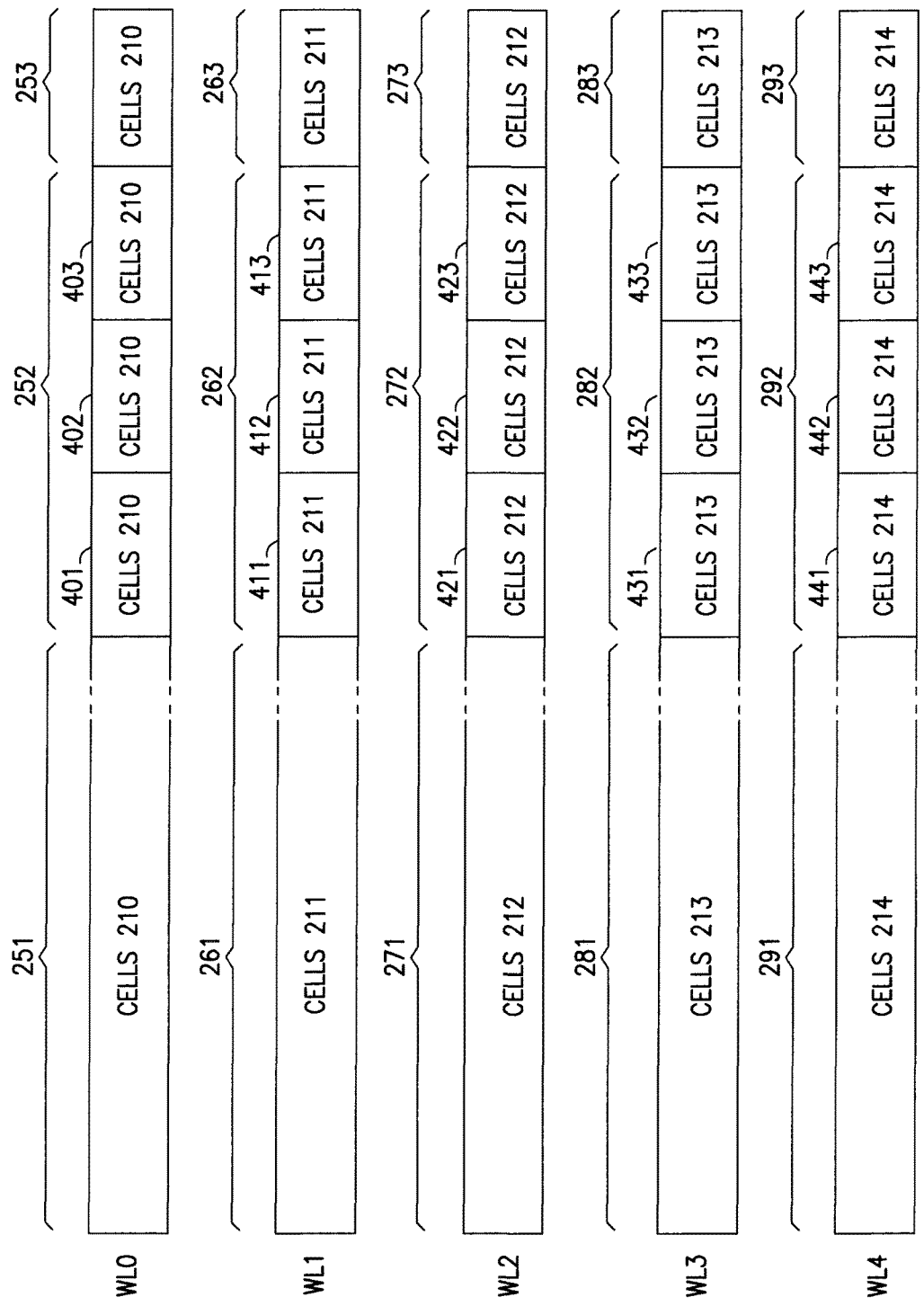
FIG. 4 shows a block diagram corresponding to memory portions of the memory device of FIG. 2, according to an embodiment of the invention.

FIG. 4 shows a block diagram corresponding of memory portions of memory cells 210, 211, 212, 213, and 214 of FIG. 2, according to an embodiment of the invention. The reference designations of the memory portions of memory cells 210, 211, 212, 213, and 214 in FIG. 4 are the same as those in FIG. 2, including (as shown in FIG. 4) memory portions 251, 252, and 253 (associated with line WL0), memory portions 261, 262, and 263 (associated with line WL1), memory portions 271, 272, and 273 (associated with line WL2), memory portions 281, 282, and 283 (associated with line WL3), and memory portions 291, 292, and 293 (associated with line WL4). The drawing in FIG. 4 is not drawn to scale.

As shown in FIG. 4, each of memory portions 252, 262, 272, 282, and 292 can include portions (e.g., subportions), such as portions 401, 402, and 403 in memory portion 252, portions 411, 412, and 413 in memory portion 262, portions 421, 422, and 423 in memory portion 272, portions 431, 432, and 433 in memory portion 282, and portions 441, 442, and 443 in memory portion 292.

Portions 401, 402, and 403 can have the same size (e.g., the same number of memory cells). Each of portions 401, 402, and 403 can also have a size that is equal to the size of memory portion 253. Portions 411, 412, and 413 can have the same size (e.g., the same number of memory cells) that can equal to the size of memory portion 263. Portions 421, 422, and 423 can have the same size (e.g., the same number of memory cells) that can be equal to the size of memory portion 273. Portions 431, 432, and 433 can have the same size (e.g., the same number of memory cells) that can be equal to the size of memory portion 283. Portions 441, 442, and 443 can have the same size (e.g., the same number of memory cells) that can be equal to the size of memory portion 293.

Figure 5:
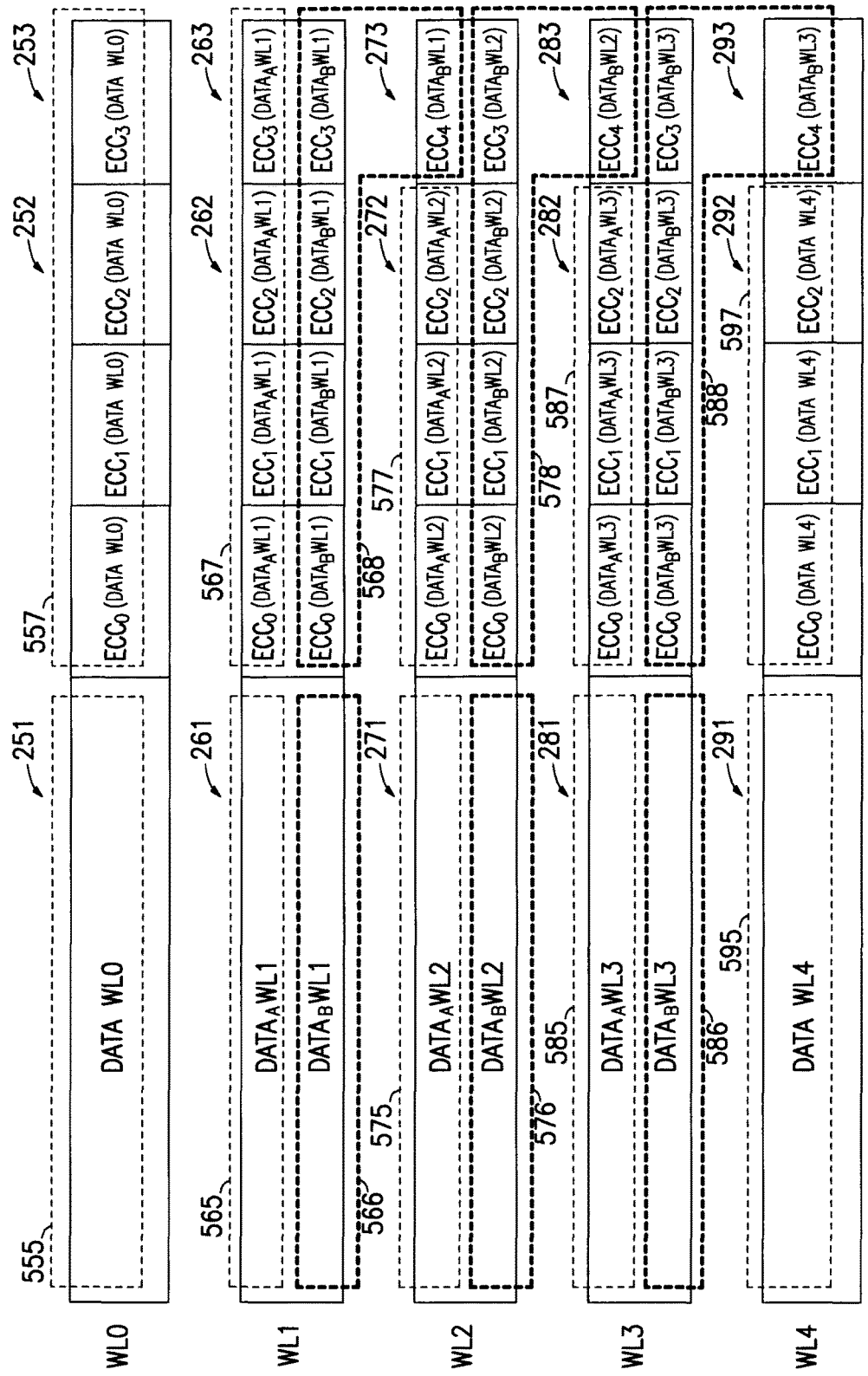
FIG. 5 shows different pages of information that can be stored in the memory portions of FIG. 4, according to an embodiment of the invention.

FIG. 5 shows different pages of information (e.g., data and ECC) that can be stored in the memory portions of FIG. 4, according to an embodiment of the invention. The reference designations of the memory portions of memory cells 210, 211, 212, 213, and 214 in FIG. 4 are the same as those in FIG. 2, including memory portions 251, 252, and 253 (associated with line WL0), memory portions 261, 262, and 263 (associated with line WL1), 271, 272, and 273 (associated with line WL2), memory portions 281, 282, and 283 (associated with line WL3), and memory portions 291, 292, and 293 (associated with line WL4).

As shown in FIG. 5, the information can include data and their associated ECC, such as data 555 and associated ECC 557, data 565 and associated ECC 567, data 566 and associated ECC 568, data 575 and associated ECC 577, data 576 and associated ECC 578, data 585 and associated ECC 587, data 586 and associated ECC 588, data 595 and associated ECC 597.

The ECC associated with particular data can be used to correct errors that may have occurred in that particular data. For example, ECC 577 can be used to correct errors that may have occurred in data 575 when data 575 is retrieved in a read operation. In another example, ECC 578 can be used to correct errors that may have occurred in data 576 when data 576 is retrieved in a read operation.

In FIG. 5, "DATA WLx", "DATA$_A$WLx", and "DATA$_B$WLx" (where x=0, 1, 2, 3, or 4) can represent different data (e.g., bits of data) among data 555, 565, 575, 585, and 595 stored in memory portions 251, 261, 271, 281, and 291 associated with lines WL0, WL1, WL2, WL3, and WL4, respectively. For example, "DATA$_A$WL1" can represent data in a page of information stored in memory portion 261 associated with line WL1. In another example, "DATA$_B$WL1" can represent data in another page of information stored in memory portion 261 of memory associated with line WL1. "DATA$_A$WL1" and "DATA$_B$WL1" can be stored in the same memory cells of memory portion 261 associated with line WL1. "DATA$_A$WL2" and "DATA$_B$WL2" can represent data in two different pages of information stored in memory portion 271 associated with line WL2. "DATA$_A$WL3" and "DATA$_B$WL3" can represent data in two different pages of information stored in memory portion 281 associated with line WL3.

Data in different pages of information can have the same size (e.g., the same number of bits). For example, data 555, 565, 566, 575, 576, 585, 586, and 595 (e.g., represented by "DATAWLx", "DATA$_A$WLx", and "DATA$_B$WLx") can have the same number of bits (e.g., 65,536 bits=8×8×2$^{10}$=8 Kbytes).

"$ECC_Y$ (DATA WLx)", "$ECC_Y$ ($DATA_A$WLx)", and "$ECC_Y$ ($DATA_B$WLx)", where Y=0, 1, 2, 3, or 4, can represent different sets (e.g., sets of parity check bits) of ECCs 557, 567, 577, 587, 588, and 597 associated with data stored in memory portions 251, 261, 271, 281, and 291. For example, "$ECC_0$ ($DATA_A$WL2)", "$ECC_1$ ($DATA_A$WL2)", "$ECC_2$ ($DATA_A$WL2)" can represent three sets of ECC associated with data "$DATA_A$WL2". In another example, "$ECC_0$ ($DATA_B$WL2)", "$ECC_1$ ($DATA_B$WL2)", "$ECC_2$ ($DATA_B$WL2)", "$ECC_3$ ($DATA_B$WL2)" and "$ECC_4$ ($DATA_B$WL2)" can represent five sets of ECC associated with data "$DATA_B$WL2".

"$ECC_Y$ (DATA WLx)", "$ECC_Y$ ($DATA_A$WLx)", and "$ECC_Y$ ($DATA_B$WLx)" can have the same size (e.g., the same number of bits, such as 512 bits=64 bytes).

The data and ECC shown in FIG. 5 can be organized into pages of information. For example, a page of information stored in the memory portions associated with line WL2 can include "$DATA_A$WL2", "$ECC_0$ ($DATA_A$WL2)", "$ECC_1$ ($DATA_A$WL2)", "$ECC_2$ ($DATA_A$WL2)", and "$ECC_4$ ($DATA_B$WL1)". Another page of information stored in the memory portions associated with line WL2 can include "$DATA_B$WL2", "$ECC_0$ ($DATA_B$WL2)", "$ECC_1$ ($DATA_B$WL2)", "$ECC_2$ ($DATA_B$WL2)", and "$ECC_3$ ($DATA_B$WL2)".

As shown in FIG. 5, data from different pages of information can be stored in the same memory portion associated with the same line WL0, WL1, WL2, WL3, or WL4. For example, data "$DATA_A$WL2" and "$DATA_B$WL2" from two different pages of information can be stored in the same memory portion 271 associated with line WL2.

An entire ECC associated with particular data can be organized into the same page of information as the data and can be stored in the memory portions associated with the same line (one of lines WL0, WL1, WL2, WL3, and WL4). For example, "$ECC_0$ ($DATA_A$WL2)", "$ECC_1$ ($DATA_A$WL2)", and "$ECC_2$ ($DATA_A$WL2)" associated with "$DATA_A$WL2" can be organized into the same page of information and stored in the memory portions associated with the same line WL2.

A portion (e.g., a set) of ECC associated with particular data can be organized into a page of information that is different from the page of information that includes that particular data. The different pages of information can be stored in the memory portions associated with different access lines. For example, a portion (e.g., $ECC_4$ ($DATA_B$WL2)) of ECC associated with $DATA_B$WL2 can be organized into a page of information that includes "$DATA_A$WL3", "$ECC_0$ ($DATA_A$WL3)", "$ECC_1$ ($DATA_A$WL3)", and "$ECC_2$ ($DATA_A$WL3)" which is different from the page of information that includes $DATA_B$WL2. Thus, data and its associated ECC can be organized into two different pages of information and can be stored in memory portions associated with two different lines among lines WL0, WL1, WL2, WL3, and WL4. The two different lines (e.g., WL2 and WL3) can be physically located immediately next to the each other. Thus, the memory portions associated with different lines can include memory cells (e.g., 212 and 213) that are physically located immediately next to the each other.

As shown in FIG. 5, the memory portions associated with some of lines WL0, WL2, WL2 WL3, and WL4 (e.g., lines WL0 and WL4) can be configured to store only one page of information. For example, memory portions 251, 252, and 253 associated with line WL0 can be configured to store only one page of information that includes "DATA WL0", "$ECC_0$ (DATA WL0)", "$ECC_1$ (DATA WL0)", "$ECC_2$ (DATA WL0)", and "$ECC_3$ (DATA WL0)". In another example, memory portions 291, 292, and 293 associated with line WL4 can be configured to store only one page of information that includes "$DATA$ $WL_4$", "$ECC_0$ (DATA WL4)", "$ECC_1$ (DATA WL4)", "$ECC_2$ (DATA WL4)", and "$ECC_4$ ($DATA_B$ WL3)".

As shown in FIG. 5, memory portions associated with some of lines WL0, WL2, WL2 WL3, and WL4 (e.g., lines WL1, WL2, and WL3) can be configured to store multiple pages of information. For example, as shown in FIG. 5, memory portion 271 can be configured to store a page of information that includes data 575 and another page of information that includes data 576. In this example, if memory portion 217 includes $8 \times 8 \times 2^{10}$ memory cells and each of these memory cells is configured to store 2 bits of data, then memory portion 217 can store $8 \times 8 \times 2^{10}$ bits (8 Kbytes) of data 575 included in one page of information and another $8 \times 8 \times 2^{10}$ bits (8 Kbytes) of data 576 included in another page of information, for a total of 16 Kbytes of data.

FIG. 5 shows an example where two pages of information can be stored in each of memory portions 261, 271, and 281. The number of multiple pages that can be stored in each of memory portions 261, 271, and 281 can vary. For example, if memory cells memory portions 261, 271, and 281 are configured to store three bits of information, then each of memory portions 261, 271, and 281 can store up to three pages of information.

ECCs associated with different data can have different sizes (e.g., different numbers of sets and different numbers of bits). For example, as shown in FIG. 5, ECCs 557, 567, 568, 577, 578, 587, 588, and 597 can include different numbers of sets of ECC. Each of ECCs 557 and 567 can include four sets of ECC (e.g., 64 bytes of ECC in each set for a total of 256 bytes in four sets). Each of ECCs 577, 587, and 597 can include three sets of ECC (e.g., 64 bytes of ECC in each set for a total of 192 bytes in three sets). Each of ECCs 568, 578, and 588 can include five sets of ECC (e.g., 64 bytes of ECC in each set for a total of 320 bytes in five sets).

Data in a more error-prone page of information can be associated with more sets of ECC than data in a less error-prone page of information. For example, in FIG. 5, since each of data 566, 576, and 586 are associated with five sets of ECC, the pages of information that include data 566, 576, and 586 can be referred to as more error-prone pages of information. In another example, in FIG. 5, since each of data 555, 565, 575, 585, and 595 are associated with fewer than five sets of ECC, the pages of information that include data 555, 565, 575, 585, and 595 can be referred to as less error-prone pages of information.

ECCs 557, 567, 568, 577, 578, 587, 588, and 597 can be generated using techniques including a low-density parity-check (LDPC) coding technique. For example, as is known to those skilled in the art, a generator matrix (e.g., a G-matrix) can be generated based on an LDPC code. Such generator matrix can be used to generate "$ECC_Y$ (DATA WLx)", "$ECC_Y$ ($DATA_A$WLx)", and "$ECC_Y$ ($DATA_B$WLx)" of ECCs 557, 567, 568, 577, 578, 587, 588, and 597 associated with data 555, 565, 566, 575, 576, 585, 586, and 595 respectively.

Figure 6:
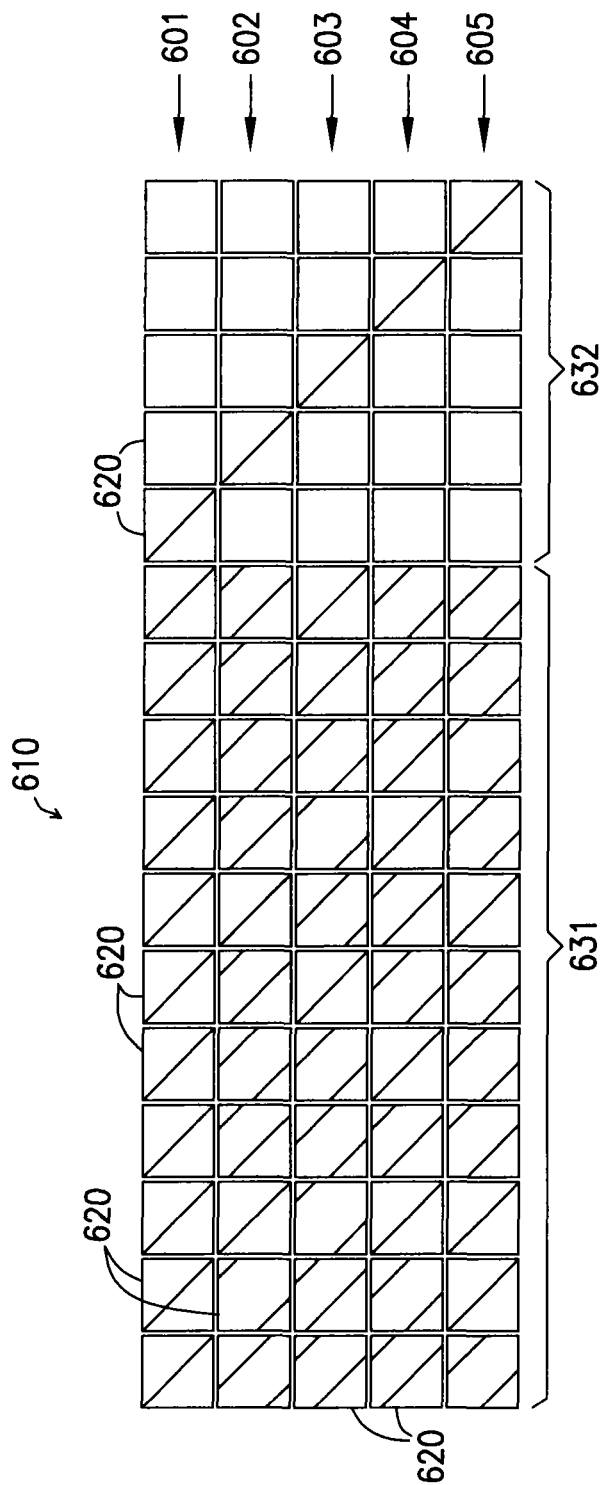
FIG. 6 shows a structure of a generator matrix, according to an embodiment of the invention.

FIG. 6 shows a structure of a generator matrix 610, according to an embodiment of the invention. Generator matrix 610 can include five layers 601, 602, 603, 604, and 605 and can be implemented in a quasi-cyclic LDPC codec, such as a five-layer quasi-cyclic LDPC encoder and a five-layer quasi-cyclic LDPC decoder. As shown in FIG. 6, each of layers 601, 602, 603, 604, and 605 can include submatrices, such as submatrices 620, forming data portion 631 and a parity check portion 632. Each of submatrices 620 can include a number of binary value "0" and "1" entries arranged in rows and columns. For simplicity, entries "0" and "1" are not shown in submatrices 620. Instead, in submatrices 620, the diagonal lines represent the locations of entries "1" and the spaces represent the locations of entries "0".

Generator matrix 610 can be used (e.g., during encoding of data) to generate ECC, such as ECCs 557, 567, 568, 577, 578, 587, 588, and 597, described above with reference to FIG. 5. Different numbers of sets (e.g., up to five sets of parity check bits) of ECC associated with particular data can be generated.

For example, five sets of ECC (e.g., $ECC_0$, $ECC_1$, $ECC_2$, $ECC_3$, and $ECC_4$) associated with particular data can be generated using all layers of generator matrix 610, such as using all five layers 601, 602, 603, 604, and 605. Thus, for particular data to be included in a more error-prone page of information, five sets of ECC associated with that particular data can be generated using all five layers 601, 602, 603, 604, and 605 of generator matrix 610.

In another example, fewer than five sets of ECC (e.g., three sets $ECC_0$, $ECC_1$, and $ECC_2$, or four sets $ECC_0$, $ECC_1$, and $ECC_2$, and $ECC_3$) associated with particular data can be generated using fewer than all layers of generator matrix 610, such as using only three layers 601, 602, and 603 (to generate three sets of ECC) or using only four layers 601, 602, 603, and 604 (to generate four sets of ECC). Thus, for particular data to be included in a less error-prone page of information, three or four sets of ECC associated with that particular data can be generated using only three layers 601, 602, and 603 or only four layers 601, 602, 603, and 604.

The sets of ECC (e.g., $ECC_0$, $ECC_1$, $ECC_2$, $ECC_3$, and $ECC_4$) generated based on generator matrix 610 can correspond to sets "$ECC_Y$ (DATA WLx)", "$ECC_Y$ ($DATA_A$ WLx)", and "$ECC_Y$ ($DATA_B$ WLx)" described above with reference to FIG. 5.

Generator matrix 610 in FIG. 6 can also be used (e.g., during decoding of data) to generate data based on ECC associated with the data if errors have occurred in the data. For example, if five sets of ECC (e.g., $ECC_0$, $ECC_1$, $ECC_2$, $ECC_3$, and $ECC_4$) are associated with particular data (e.g., during encoding of the data), then four sets of ECC corresponding to four layers (e.g., 601, 602, 603, and 604) of generator matrix 610 can be initially used to try to regenerate that particular data. If the data is unsuccessfully generated, then all five sets of ECC and all five layers (e.g., 601, 602, 603, 604, and 605) of generator matrix 610 can be used to try to regenerate that particular data. In another example, if three sets of ECC (e.g., $ECC_0$, $ECC_1$, and $ECC_2$) are associated with particular data (e.g., during encoding of the data), then three sets of ECC and the corresponding three layers (e.g., 601, 602, and 603) of generator matrix 610 can be used to try to regenerate that particular data. In another example, if four sets of ECC (e.g., $ECC_0$, $ECC_1$, $ECC_2$, and $ECC_3$) are associated with particular data (e.g., during encoding of the data), then four sets of ECC and the corresponding four layers (e.g., 601, 602, 603, and 604) of generator matrix 610 can be used to try to regenerate that particular data.

Figure 7:
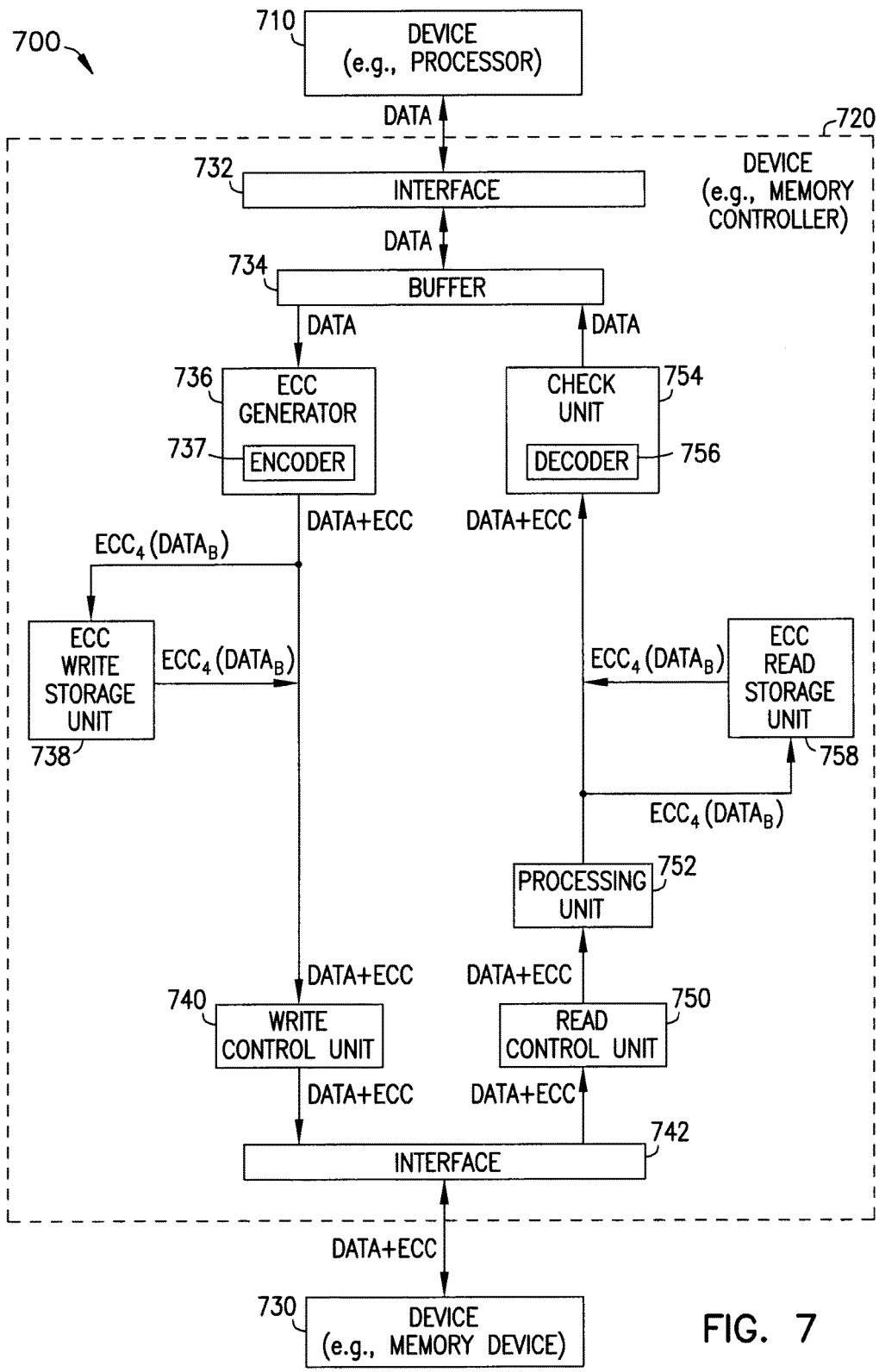
FIG. 7 shows a block diagram of an apparatus in the form of a system, according to an embodiment of the invention.

FIG. 7 shows a block diagram of an apparatus in the form of a system 700, according to an embodiment of the invention. System 700 can include devices 710, 720, and 730. Device 710 can include a processor, such as a general purpose processor or an application-specific integrated circuit (ASIC). Device 720 can include a memory controller to control a transfer of information between devices 710 and 730. Device 720 can also generate ECC associated with data, such as data transferred from device 710. Device 730 can include a memory device, such as memory device 100 of FIG. 1. Each of devices 710, 720, and 730 can be physically located on a separate semiconductor die. Alternatively, any two of devices 710, 720, and 730 or all of devices 710, 720, and 730 can be physically located on a same semiconductor die.

In FIG. 7, "DATA+ECC" can represent data and its associated ECC in system 700. The data can correspond to "DATA WLx", "$DATA_A$WLx", or "$DATA_B$WLx" included in data 555, 565, 566, 575, 576, 585, 586, and 595 described above with reference to FIG. 5. In FIG. 7, ECC can correspond to "$ECC_Y$ (DATA WLx)", "$ECC_Y$ ($DATA_A$ WLx)", and "$ECC_Y$ ($DATA_B$ WLx)" included in ECC 557, 567, 568, 577, 578, 587, 588, and 597 described above with reference to FIG. 5. In FIG. 7, $ECC_4$ ($DATA_B$) can correspond to "$ECC_4$ ($DATA_B$ WL1)", "$ECC_4$ ($DATA_B$ WL2)", or "$ECC_4$ ($DATA_B$ WL3)" described above with reference to FIG. 5.

The following description describes an example operation (e.g., write operation) in system 700 to store information in device 730. In this example operation, device 710 can transfer data (to be stored in device 730) to device 720. Then, device 720 can generate ECC associated with the data and transfer both the data and its associated ECC to device 730 for storage therein.

In this example operation, an interface 732 of device 720 can receive data from device 710 and transfer the received data to a buffer 734. Device 720 can include an ECC generator 736 to receive data from buffer 734 and generate ECC associated with the data.

ECC generator 736 can include an encoder 737 to generate ECC based at least in part on a generator matrix (e.g., generator matrix 610 of FIG. 6) implemented in ECC generator 736. The ECC generated by ECC generator 736 can include different numbers of ECC sets (e.g., sets of parity check bits). For example, the ECC can include three, four, or five sets, depending on which page of information will include the data before that page of information is sent to device 730. For example, as described above with reference to FIG. 5 and FIG. 6, ECC associated with data in a more error-prone page of information can include five sets of ECC. ECC associated with data in a less error-prone page of information can include three or four sets of ECC.

In FIG. 7, for example, if the data is included in a less error-prone page of information, then the ECC generated by ECC generator 736 for that particular data can include three or four sets of ECC, which can be similar to or identical to three sets $ECC_0$, $ECC_1$, and $ECC_2$ in each of ECC 577, 587, and 597 of FIG. 5 or four sets $ECC_0$, $ECC_1$, $ECC_2$, and $ECC_3$ in each of ECC 557 and 567. In another example, if the data transferred to device 720 is included in a more error-prone page of information, then the ECC generated by ECC generator 736 based on particular data can include five sets, which can be similar to or identical to the ECC sets $ECC_0$, $ECC_1$, $ECC_2$, $ECC_3$, and $ECC_4$ in each of ECC 568, 578, and 588 of FIG. 5.

Device 720 in FIG. 7 can include an ECC write storage unit 738 to store a portion of ECC associated with particular data in a more error-prone page of information. The portion of ECC stored in ECC write storage unit 738 can include only one set (e.g., $ECC_4$ ($DATA_B$)) among the five sets of ECC associated with that particular data.

Device 720 can organize data and ECC into pages of information and transfer them to device 730 for storage therein. Each page of information can include data and four sets of ECC. The four sets of ECC can be ECC associated with the same data and/or different data. For example, a more error-prone page of information can include data (e.g., data 566, 576, and 586 in FIG. 5) and four out of five sets (e.g., $ECC_0$, $ECC_1$, $ECC_2$, and $ECC_3$) of ECC associated with that same data. A less error-prone page of information can include data (e.g., data 555 and 556 in FIG. 5) and all four sets of its associated ECC (e.g., $ECC_0$, $ECC_1$, $ECC_2$, and $ECC_3$).

A less error-prone page of information can also include data (e.g., data 575, 585, and 595 in FIG. 5) and all three sets of its associated ECC (e.g., $ECC_0$, $ECC_1$, and $ECC_2$). A fourth set of ECC in a less error-prone page of information comes from the ECC set (e.g., $ECC_4$ ($DATA_B$)) that is stored in ECC write storage unit 738. As described above, the ECC set (e.g., $ECC_4$ ($DATA_B$)) stored in ECC write storage unit 738 is associated with data included a more error-prone page of information. Device 720 can transfer the ECC set (e.g., $ECC_4$ ($DATA_B$)) stored in ECC write storage unit 738 to device 730 at a time different from the transfer of the rest of the ECC associated with data in a more error-prone page of information, as described below.

After generation of ECC (e.g., five ECC sets) associated with particular data to be included in a more error-prone page of information, device 720 can store a portion of ECC (e.g., $ECC_4$ ($DATA_B$)) associated with that particular data and transfer that particular data and the rest (e.g., four sets $ECC_0$, $ECC_1$, $ECC_2$, and $ECC_3$) of its associated ECC in a page of information to an interface 742 through a write control unit 740. The portion of the ECC stored in ECC write storage unit 738 can remain stored in ECC write storage unit 738 during and after the other portion of ECC associated with that particular data is transferred to the interface 742. Thus, after Responsive to generation of ECC (e.g., three ECC sets) associated with particular data to be included in a less error-prone page of information, device 720 can retrieve the portion of ECC (e.g., $ECC_4$ ($DATA_B$)) stored in ECC write storage unit 738 and transfer it together with the data and associated ECC (e.g., three ECC sets) in the less error-prone page of information to interface 742.

Device 730 can include memory cells (not shown in FIG. 7) that can be configured to store pages of information (data and ECC received from device 720) in a fashion similar to or identical to those described above with reference to FIG. 5.

The following description describes another example operation (e.g., read operation) in system 700 to retrieve stored information from device 730. In this example operation, device 720 can receive information, including data and ECC, from device 730 at an interface 742. Device 720 can include a read control unit 750 and a processing unit 752 to process the information. Device 720 can include a check unit 754 to generate data from the information.

Check unit 754 can include a decoder 756 to generate data based at least in part on a generator matrix implemented in check unit 754, which can be the same as the generator matrix implemented in ECC generator 736.

Device 720 can generate data based on only a portion of the layers (e.g., fewer than all layers) of the generator matrix. For example, for a less error-prone page of information, device 720 can use only three (or four) layers of the generator matrix to generate data. For a more error-prone page of information, device 720 can either use only a portion (e.g., four layers) of all layers or use all layers (e.g., five) of the generator matrix to generate data. For example, device 720 can be configured to normally use fewer than all layers of the generator matrix to generate data from a more error-prone page of information. If device 720 is unable to successfully generate the data using fewer than all layers, then it will use all layers of the generator matrix and repeat the process to generate the data.

The following description describes an example operation where device 720 generates data when it receives a more error-prone page of information from device 730. For ease of describing the example, information shown in FIG. 5 is used. In this example operation, device 720 receives from device 730 a page of information, such as the page of information that includes data $DATA_B WL2$ and four sets of its associated ECC, "$ECC_0$ ($DATA_B WL2$)", "$ECC_1$ ($DATA_B WL2$)", "$ECC_2$ ($DATA_B WL2$)", and "$ECC_3$ ($DATA_B WL2$)" (FIG. 5). As shown in FIG. 5, this page of information is stored in memory portions 271, 272, and 273 associated with line WL2. In FIG. 7, device 720 uses four sets of the ECC ($ECC_0$ ($DATA_B WL2$), $ECC_1$ ($DATA_B WL2$), $ECC_2$ ($DATA_B WL2$), and $ECC_3$ ($DATA_B WL2$)) and four layers of the generator matrix to generate the data (e.g., $DATA_B WL2$). If device 720 is able to generate the data from the received page of information (including four sets of ECC), it will transfer the data to device 710.

If device 720 is unable to generate the data (e.g., $DATA_B WL2$) from the received page of information (including four sets of ECC), it will try again using all layers (e.g., five) of the generator matrix and all sets of ECC (e.g., five) associated with the data, including a fifth set (e.g., $ECC_4$ ($DATA_B WL2$) in FIG. 5) of ECC associated with the data. Device 720 can include an ECC read storage unit 758 to store a portion (e.g., $ECC_4$ ($DATA_B WL2$)) of ECC associated with data included in a more error-prone page of information in a second attempt to generate the data.

During a second attempt to generate the data, device 720 retrieves $ECC_4$ ($DATA_B WL2$) from memory portion 283 (FIG. 5) and stores $ECC_4$ ($DATA_B WL2$) in ECC read storage unit 758. Then, device 720 retrieves $DATA_B WL2$ and "$ECC_0$ ($DATA_B WL2$)", "$ECC_1$ ($DATA_B WL2$)", "$ECC_2$ ($DATA_B WL2$)", and "$ECC_3$ ($DATA_B WL2$)" from the page of information from which device 720 was unable to generate the data. This time, device 720 can use all five sets of ECC ($ECC_0$ ($DATA_B WL2$), $ECC_1$ ($DATA_B WL2$), $ECC_2$ ($DATA_B WL2$), $ECC_3$ ($DATA_B WL2$), $ECC_4$ ($DATA_B WL2$)) and five layers of the generator matrix to generate the data (e.g., $DATA_B WL2$).

In some situations (e.g., power down) in system 700, a portion (e.g., $ECC_4$ $DATA_B$) of the ECC associated with particular data in a more error-prone page of information may not have been stored in ECC write storage unit 738 after that particular data is stored in device 730. In this situation, before performing a write operation to store new data in device 730, device 720 can retrieve (e.g., in a read operation) that particular data (data already stored) from device 730. After the stored data is retrieved, device 730 can generate (e.g., regenerate) the entire ECC (e.g., all five sets of ECC) associated with that data. Then, device 720 can store the portion (e.g., $ECC_4$ $DATA_B$) of ECC in ECC write storage unit 736 and then store that portion of ECC in device 730 together with data and ECC in a less error-prone page of information, as described above.

System 700 may include an additional storage unit (not shown in FIG. 7) to maintain (e.g., store) a large number of ECC, such that regenerating a portion of ECC (e.g., $ECC_4$ $DATA_B$) in some situations (e.g., power down) as described above, may be avoided. The large number of ECC can include all five sets of ECC (e.g., entire ECC) associated with data in one or more pages of information. The additional storage unit in system 700 can include large memory (e.g., non-volatile memory) such as a large on-board cache memory in device 720. In some cases, the additional storage unit can be included as part of ECC write storage unit 738.

Figure 8:
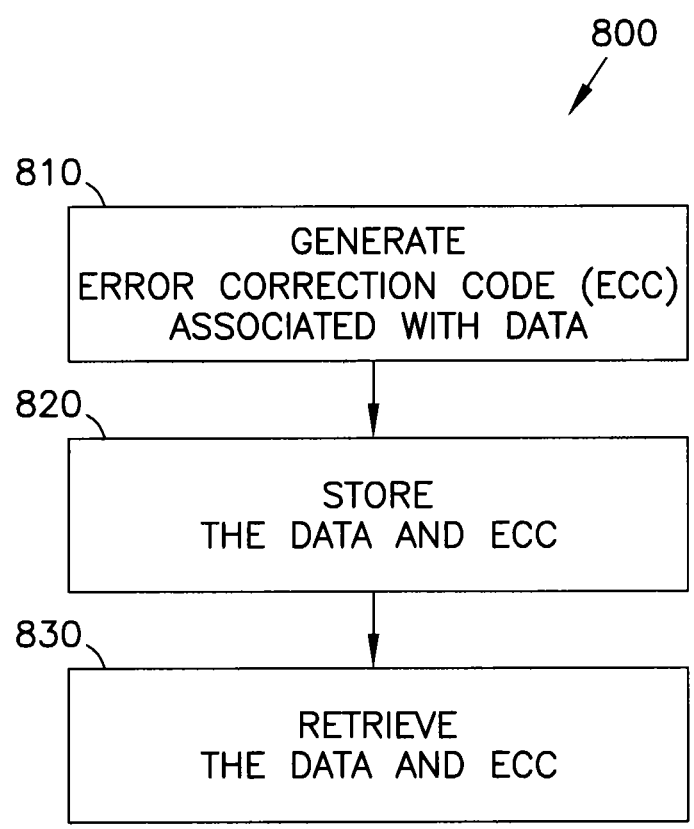
FIG. 8 is a flow diagram showing a method of operating a system, according to an embodiment of the invention.

FIG. 8 is a flow diagram showing a method 800 of operating a system, according to an embodiment of the invention. Methods 800 can include activities 810, 820, and 830. All or part of activities 810, 820, and 830 can be used in an apparatus, such as memory device 100 of FIG. 1, memory device 200 of FIG. 2, or system 700 of FIG. 7.

Activity 810 can include generating ECC associated with data. Activity 820 can include storing the data and ECC. Activity 830 can include retrieving the data and ECC. Activities 810, 820, and 830 can include some or all of the activities performed by an apparatus (e.g., memory devices 100 and 200 and system 700) described above with reference to FIG. 1 through FIG. 7.

The illustrations of apparatuses (e.g., memory devices 100 and 200 and system 700) and methods (e.g., method 800) are intended to provide a general understanding of the structure of various embodiments and are not intended to provide a complete description of all the elements and features of apparatuses that might make use of the structures described herein. An apparatus herein refers to, for example, either a device (e.g., memory devices 100 and 200) or a system (e.g., system 700) that includes a device such as memory devices 100 and 200.

Memory devices 100 and 200 and system 800 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses and methods having first memory cells, a first access line configured to access the first memory cells, second memory cells, and a second access line configured to access the second memory cells. One of such apparatuses can include a controller configured to cause data to be stored in a memory portion of the first memory cells, to cause a first portion of an error correction code associated with the data to be stored in another memory portion of the first memory cells, and to cause a second portion of the error correction code to be stored in the second memory cells. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a controller to cause data to be stored in a first memory cell group of first memory cells of a memory device, to cause a first portion of an error correction code associated with the data to be stored in a second memory cell group of the first memory cells, the first memory cells located on a first level of the memory device;
    the controller to cause additional data to be stored in a first memory cell group of second memory cells of the memory device and to cause a second portion of the error correction code to be stored in a second memory cell group of the second memory cells, the second memory cells located on a second level of the memory device; and
    the controller to cause at least a portion of an error correction code associated with the additional data to be stored in a third memory cell group of the second memory cells concurrently with storing of the second portion of the error correction code in the second memory cell group of the second memory cells, the controller including;
    an error correction code generator configured to generate the first and second portions of the error correction code, and the at least a portion of the error correction code associated with the additional data;
    a write control unit coupled to the error correction code generator through a path and configured to transfer the data, the additional data, the first and second portions of the error correction code, and the error correction code associated with the additional data to the memory device; and
    a storage unit including an input coupled to the path to receive the second portion of the error correction code and store the second portion of the error correction code when the first portion of the error correction code is transferred to the write control unit, the storage unit including an output coupled to the path to provide the second portion of the error correction code to the write control unit after the first portion of the error correction code is transferred to the write control unit.

2. The apparatus of claim 1, wherein the controller is further configured to cause an additional portion of the error correction code associated with the data to be stored in a third memory cell group of the first memory cells.

3. The apparatus of claim 1, wherein the data includes a page of information, and the error correction code is associated with the page of information.

4. The apparatus of claim 1, wherein the memory device includes a first access line to access the first memory cells, and a second access line to access the memory device.

5. The apparatus of claim 4, wherein the first access line is located immediately next to the second access line.

6. The apparatus of claim 1, wherein the first and second memory cells are located on a semiconductor die, and the controller is located on another semiconductor die.

7. An apparatus comprising:
    a controller to:
    store first data in first memory cells of a memory device, the first memory cells associated with a first access line of the memory device;
    store second data in a first memory cell group of second memory cells of the memory device, the second memory cells associated with a second access line of the memory device;

store at least a portion of an error correction code associated with the second data in a second memory cell group of the second memory cells; and store a portion of an error correction code associated with the first data in a third memory cell group of the second memory cells, wherein the controller is configured to concurrently store the at least a portion of the error correction code associated with the second data and the portion of the error correction code associated with the first data, the controller including:

an error correction code generator configured to generate the portion of the error correction code associated with the first data, the at least a portion of the error correction code associated with the second data, and an additional portion of the error correction code associated with the second data;

a write control unit coupled to the error correction code generator through a path and configured to transfer the first data, the second data, the portion of the error correction code associated with the first data, the at least a portion of the error correction code associated with the second data, and the additional portion of the error correction code associated with the second data; and a storage unit including an input coupled to the path to receive the at least a portion of the error correction code associated with the second data and store the at least a portion of the error correction code associated with the second data when the additional portion of the error correction code associated with the second data is transferred to the write control unit, the storage unit including an output coupled to the path to provide the at least a portion of the error correction code associated with the second data to the write control unit after the additional portion of the error correction code associated with the second data is transferred to the write control unit.

8. The apparatus of claim 7, wherein the controller is further configured to store at least a portion of an error correction code associated with third data in the second memory cell group of the second memory cells.

9. The apparatus of claim 8, wherein the controller is further configured to store an additional portion of the error correction code associated with the third data in the third memory cell group of the second memory cells.

10. The apparatus of claim 9, wherein the portion of the error correction code associated with the first data is stored in the third memory cell group of the second memory cells before the additional portion of the error correction code associated with the third data is stored in the third memory cell group of the second memory cells.

11. The apparatus of claim 7, wherein the at least a portion of the error correction code associated with the second data and the portion of the error correction code associated with the first data have difference sizes.

12. An apparatus comprising:
a controller to:
retrieve information from first memory cells of a memory device, the first memory cells associated with a first access line of the memory device;
generate data from the information using a first portion of error correction code associated with the data, the first portion of the error correction code associated with the data being included in the information;
retrieve a second portion of the error correction code associated with the data from second memory cells of the memory device if the data is unsuccessfully generated from the information using the first portion of the error correction code associated with the data, the second memory cells associated with a second access line of the memory device; and
generate data using the first portion of the error correction code associated with the data and the second portion of the error correction code associated with the data, wherein the controller is to cause at least a portion of an error correction code associated with additional data to be stored in the memory device concurrently with storing of the second portion of the error correction code in the memory device, the controller including:
an error correction code generator configured to generate the first and second portions of the error correction code, and the at least a portion of the error correction code associated with the additional data;
a write control unit coupled to the error correction code generator through a path and configured to transfer the data, the additional data, the first and second portions of the error correction code, and the error correction code associated with the additional data to the memory device; and
a storage unit including an input coupled to the path to receive the second portion of the error correction code and store the second portion of the error correction code when the first portion of the error correction code is transferred to the write control unit, the storage unit including an output coupled to the path to provide the second portion of the error correction code to the write control unit after the first portion of the error correction code is transferred to the write control unit.

13. The apparatus of claim 12, wherein the first portion of the error correction code associated with the data and the second portion of the error correction code associated with the data have unequal sizes.

14. The apparatus of claim 12, wherein the controller is configured to generate the first and second portions of the error correction code based on the data before the information is stored.

15. The apparatus of claim 14, herein the controller is located on a memory controller separated from the memory device.

16. The apparatus of claim 12, wherein the first and second memory cells and the controller are located on a same semiconductor die of the memory device.

17. The apparatus of claim 12, wherein the first and second memory cells and the controller are located different semiconductor dice.

* * * * *